(12) United States Patent
Ma et al.

(10) Patent No.: US 11,475,804 B2
(45) Date of Patent: Oct. 18, 2022

(54) DISPLAY PANEL HAVING AN AUXILIARY LAYER OVERLAPPED WITH A BENDABLE REGION

(71) Applicant: Au Optronics Corporation, Hsinchu (TW)

(72) Inventors: Chien-Kai Ma, Hsinchu (TW); Yung-Hsiang Lan, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 323 days.

(21) Appl. No.: 16/923,106

(22) Filed: Jul. 8, 2020

(65) Prior Publication Data
US 2021/0027672 A1   Jan. 28, 2021

Related U.S. Application Data

(60) Provisional application No. 62/878,857, filed on Jul. 26, 2019.

(30) Foreign Application Priority Data

Feb. 27, 2020   (TW) .................................. 109106499

(51) Int. Cl.
*H01L 27/32*   (2006.01)
*G09F 9/30*   (2006.01)
(Continued)

(52) U.S. Cl.
CPC .............. *G09F 9/301* (2013.01); *G09G 5/006* (2013.01); *H01L 27/3276* (2013.01); *H01L 51/5253* (2013.01); *H05K 1/028* (2013.01)

(58) Field of Classification Search
CPC . H01L 27/32; H01L 27/3244; H01L 27/3276; H01L 23/4985; H01L 51/5253; H01L 2251/5338
(Continued)

(56) References Cited

U.S. PATENT DOCUMENTS 9,865,842 B2   1/2018 Song
10,461,268 B2   10/2019 Jiang et al.
(Continued)

FOREIGN PATENT DOCUMENTS

| CN | 105609660 | 5/2016 |
|---|---|---|
| CN | 108417608 | 8/2018 |

(Continued)

*Primary Examiner* — Hoai V Pham
(74) *Attorney, Agent, or Firm* — JCIPRNET

(57) ABSTRACT

A display panel including a substrate, multiple display pixels, an encapsulation structure, and an auxiliary layer is provided. The substrate includes a display region, a bendable region, and a buffer region positioned therebetween. The display pixels are disposed in the display region. The encapsulation structure is overlapped with the display region and covers the display pixels. The auxiliary layer is overlapped with the bendable region and has a top surface. A first height is included between a top surface of the auxiliary layer and a surface of the substrate. The auxiliary layer and the encapsulation structure define a recess overlapped with the buffer region. A second height is included between a bottom surface of the recess positioned in the buffer region and the surface of the substrate. A difference between the first height and the second height is greater than 0 μm and less than or equal to 4 μm.

14 Claims, 6 Drawing Sheets

(51) Int. Cl.
  *H01L 51/52* (2006.01)
  *H05K 1/02* (2006.01)
  *G09G 5/00* (2006.01)
(58) Field of Classification Search
  USPC .......................................................... 257/59
  See application file for complete search history.

(56) References Cited

U.S. PATENT DOCUMENTS

| | | |
|---|---|---|
| 2017/0279076 A1 | 9/2017 | Song |
| 2019/0019966 A1 | 1/2019 | Jiang et al. |
| 2021/0273026 A1* | 9/2021 | Seo .................... H01L 27/3234 |

FOREIGN PATENT DOCUMENTS

| | | |
|---|---|---|
| CN | 109103347 | 12/2018 |
| CN | 109136834 | 1/2019 |
| TW | 201320275 | 5/2013 |

* cited by examiner

DISPLAY PANEL HAVING AN AUXILIARY LAYER OVERLAPPED WITH A BENDABLE REGION

CROSS-REFERENCE TO RELATED APPLICATION

This application claims the priority benefits of U.S. provisional application Ser. No. 62/878,857, filed on Jul. 26, 2019, and Taiwan application serial No. 109106499, filed on Feb. 27, 2020. The entirety of each of the above-mentioned patent applications is hereby incorporated by reference here and made a part of this specification.

BACKGROUND OF THE INVENTION

1. Field of the Invention

The invention relates to an electronic device, and in particular, to a display panel.

2. Description of Related Art

With development of a display technology, display panels are increasingly widely used. For example, at an early stage, display panels were mostly used as screens for electronic devices (e.g., televisions, computers, mobile phones, etc.), and the display panels applied to the electronic devices were mostly hard display panels; recently, display panels are applied to wearable devices (e.g., watches, clothes, etc.), and the display panels applied to the wearable devices are mostly flexible display panels. The flexible display panels are required to be flexible enough. In other words, when a flexible display panel is bent, components on a flexible substrate (e.g., a thin film transistor, a data line, a scan line, peripheral wiring, etc.) need to be bent accordingly and maintain normal functions.

To achieve the above objective, an additional film is configured in a bending region to dispose the above circuit components near a neutral axis to minimize a stress on the circuit components. However, a segment gap between the additional film and a functional film in the display region is prone to accumulation of bubbles in a process of manufacturing a display panel. When the display panel is bent, circuit wiring near the segment gap is prone to breakage under deformation extrusion of the bubbles, resulting in failure of the flexible display panel.

SUMMARY OF THE INVENTION

The invention is directed to a display panel, which has a better production yield.

The display panel in the invention includes a substrate, a plurality of display pixels, an encapsulation structure, and an auxiliary layer. The substrate includes a display region, a bendable region, and a buffer region positioned between the display region and the bendable region. The plurality of display pixels are disposed in the display region. The encapsulation structure is overlapped with the display region and covers the display pixels. The auxiliary layer is overlapped with the bendable region and includes a top surface. A first height is included between a top surface of the auxiliary layer and a surface of the substrate. The auxiliary layer and the encapsulation structure define a recess overlapped with the buffer region. A second height is included between a bottom surface of the recess positioned in the buffer region and the surface of the substrate. A difference between the first height and the second height is greater than 0 μm and less than or equal to 4 μm.

In an embodiment of the invention, the auxiliary layer of the display panel extends from the bendable region into the buffer region.

In an embodiment of the invention, the display panel further includes an isolation structure layer disposed in the display region. The isolation structure layer defining a plurality of pixel regions, and the display pixels are overlapped with the pixel regions respectively. The auxiliary layer includes a first sub-layer extending into the buffer region, and the first sub-layer and the isolation structure layer are in a same film.

In an embodiment of the invention, the display panel further includes a flat layer. The flat layer is disposed in the display region, and is positioned between the substrate and the isolation structure layer. The auxiliary layer includes a second sub-layer extending into the buffer region, and the second sub-layer and the flat layer are in a same film.

In an embodiment of the invention, the display panel further includes a metal pattern. The metal pattern is disposed in the display region, and is positioned between the recess and the substrate.

In an embodiment of the invention, the metal pattern of the display panel includes a floating potential.

In an embodiment of the invention, the display region, the buffer region, and the bendable region of the display panel are arranged in a first direction, and an extension direction of the metal pattern is perpendicular to the first direction.

In an embodiment of the invention, the display panel further includes an insulating layer. The insulating layer is overlapped with the display region, and extends into the buffer region. A first part of the insulating layer in the display region includes a first thickness. A second part of the insulating layer in the buffer region includes a second thickness, and the second thickness is greater than the first thickness.

In an embodiment of the invention, the display panel further includes a signal line and an insulating layer overlapped with the display region. The signal line is electrically connected to the plurality of display pixels. The insulating layer covers the signal line, and extends into the buffer region.

In an embodiment of the invention, a third height is included between a surface of a first part of the insulating layer of the display panel in the display region and the surface of the substrate. A fourth height is included between a surface of a second part of the insulating layer in the buffer region and the surface of the substrate, and the fourth height is greater than the third height.

In an embodiment of the invention, the display panel further includes a metal pattern. The metal pattern is disposed in the buffer region, and is positioned on the insulating layer. The auxiliary layer extends from the bendable region into the buffer region, and covers the metal pattern.

In an embodiment of the invention, a material of the auxiliary layer of the display panel includes an organic material.

In an embodiment of the invention, the recess of the display panel includes a width in a direction of the display region toward the bendable region, and the width is greater than 10 μm.

In an embodiment of the invention, the display panel further includes a filling layer. The filling layer covers the encapsulation structure, the auxiliary layer and the recess positioned in the buffer region.

Based on the above, in the display panel according to an embodiment of the present invention, the encapsulation structure overlapped with the display region and the auxiliary layer overlapped with the bendable region define a recess in the buffer region. A height difference between the top surface of the auxiliary layer and the bottom surface of the recess being greater than 0 μm and less than or equal to 4 μm can avoid accumulation of bubbles generated on a side of the recess close to the auxiliary layer and breakage of circuit wiring in the buffer region caused by deformation extrusion of the bubbles in a process of manufacturing the display panel, which helps to improve a process margin and a production yield of the display panel.

DESCRIPTION OF THE EMBODIMENTS

Figure 1:
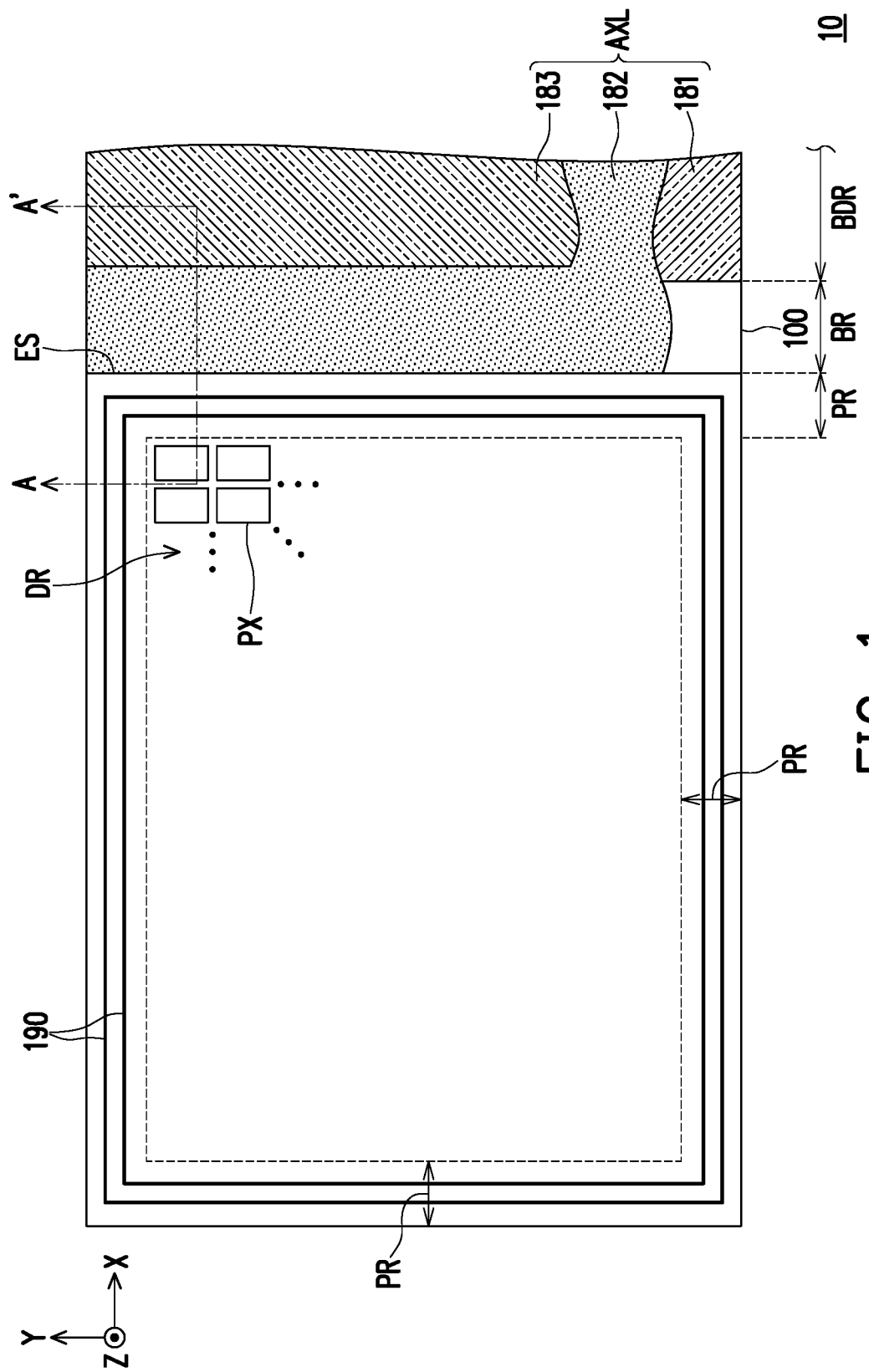
FIG. 1 is a schematic top view of a display panel according to a first embodiment of the invention.

The term "about," "approximately," "essentially," or "substantially" used herein includes the value and an average value within an acceptable deviation range of specific values determined by a person of ordinary skill in the art, taking into account discussed measurements and a specific number of measurement-related errors (i.e., limitations of a measuring system). For example, the term "about" may mean being within one or more standard deviations of the value, or within, for example, ±30%, ±20%, ±15%, ±10%, and ±5%. Moreover, the term "about," "approximately," "essentially," or "substantially" used herein may mean selecting a more acceptable deviation range or standard deviations according to measurement properties, cutting properties or other properties, without applying a single standard deviation to all properties.

In the accompanying drawings, thicknesses of layers, films, panels, regions, and so on are enlarged for clarity. It should be understood that when an element such as a layer, a film, a region, or a substrate is referred to as being "on" or "connected to" another element, it may be directly on or connected to the another element, or there may be an intermediate element between the two elements. In contrast, when an element is referred to as being "directly on another element" or "directly connected to" the another element, there is no intermediate element. As used herein, "connected" may mean being physically and/or electrically connected. Furthermore, "electrically connected" may mean that there are other elements between the two elements.

In addition, relative terms such as "lower" or "bottom" and "upper" or "top" may be used herein to describe a relationship between an element and another element, as shown in the figures. It should be understood that the relative terms are intended to include different orientations of a device in addition to the orientations shown in the figures. For example, if a device in a figure is flipped, an element described as being on a "lower" side of another element is oriented to an "upper" side of the another element. Therefore, the exemplary term "lower" may include "lower" and "upper" orientations, depending on a specific orientation of the figure. Similarly, if a device in a figure is flipped, an element described as being "below" another element or "below" is oriented to being "above" the another element. Therefore, the exemplary term "above" or "below" may include up and down orientations.

Now, reference is made in detail to exemplary implementations of the invention. Examples of the exemplary implementations are illustrated in the accompanying drawings. Where possible, identical reference numerals are used in the drawings and descriptions to represent identical or similar parts.

Figure 2:
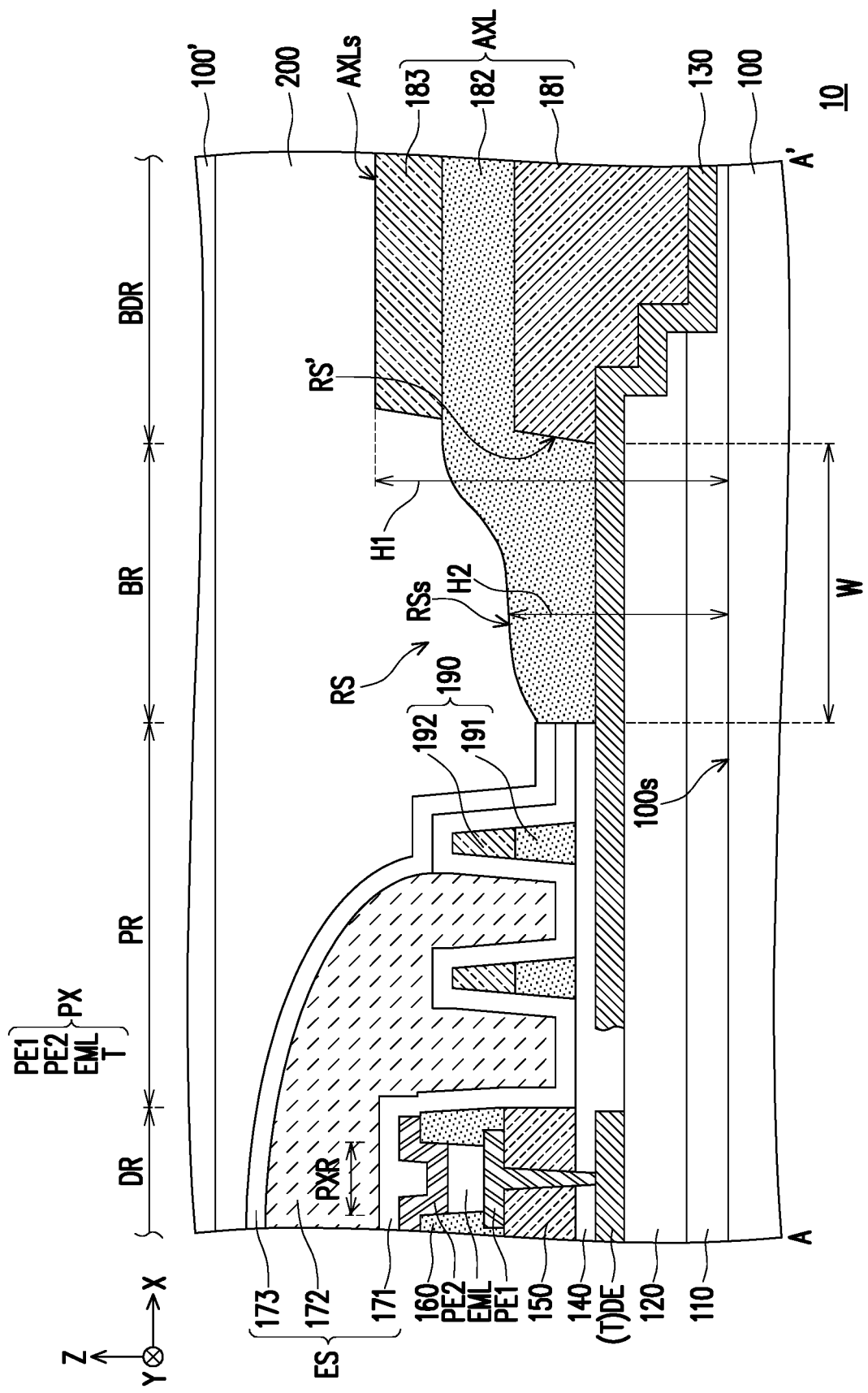
FIG. 2 is a schematic cross-sectional view of the display panel in FIG. 1.

FIG. 1 is a schematic top view of a display panel according to a first embodiment of the invention. FIG. 2 is a schematic cross-sectional view of the display panel in FIG. 1. FIG. 2 corresponds to a profile A-A' in FIG. 1. Particularly, illustrations of a substrate 100', an insulating layer 110, an insulating layer 120, a signal line 130, an insulating layer 140, a flat layer 150, an isolation structure layer 160, and a filling layer 200 in FIG. 2 are omitted in FIG. 1 for clarity.

Referring to FIG. 1 and FIG. 2, a display panel 10 includes a substrate 100 and a plurality of display pixels PX disposed on the substrate 100. In the present embodiment, the substrate 100 is, for example, a soft substrate, and a material of the soft substrate may include polyimide (PI), polyethylene terephthalate (PET), and polycarbonate (PC), but the invention is not limited thereto. In other embodiments, the material of the substrate 100 may also include glass, quartz, or other appropriate organic polymers.

The substrate 100 includes a display region DR, a peripheral region PR, a buffer region BR, and a bendable region BDR. The buffer region BR is positioned between the bendable region BDR and the display region DR. The peripheral region PR is positioned between the display region DR and the buffer region BR. The display region DR, the buffer region BR, and the bendable region BDR are sequentially arranged along a direction X. For example, in the present embodiment, the peripheral region PR may be disposed around the display region DR, but the invention is not limited thereto. In other embodiments, the peripheral region PR may also be disposed only on two opposite sides of the display region DR according to actual design requirements, for example, on two opposite sides of the display region DR in the direction X.

In the present embodiment, the plurality of display pixels PX disposed in the display region DR may be arrayed on the substrate 100, for example, the display pixels PX may be arranged into a plurality of pixel rows and a plurality of pixel columns along directions X and Y respectively, but the invention is not limited thereto. It should be understood that the display panel 10 may further include a plurality of signal lines (not shown in FIG. 1). The signal lines extend in the directions X and Y respectively, and are electrically connected to the plurality of display pixels PX respectively. For example, the signal lines may include a data line, a scan line, a power line, and a sensing line.

Further, the display panel 10 may further include an insulating layer 110, an insulating layer 120, a signal line 130, an insulating layer 140, a flat layer 150, and an isolation structure layer 160 sequentially stacked on the substrate 100. In detail, the insulating layer 110 and the insulating layer 120 that cover the display region DR extend into the bendable region BDR, and a cross section (e.g., XZ plane) of a part of a stacked structure formed by the two insulating layers in the bendable region BDR has a stepped profile.

Accordingly, a risk of breakage of the signal line 130 here may be reduced. It is worth noting that the insulating layer 140 covering the display region DR extends only to a junction between the peripheral region PR and the buffer region BR, but does not extend to the buffer region BR and the bendable region BDR; however, the invention is not limited thereto. In the present embodiment, materials of the insulating layer 110, the insulating layer 120, and the insulating layer 140 include inorganic materials (e.g., silicon oxide, silicon nitride, silicon oxynitride, other appropriate materials, or a stacked layer of at least two of the above materials), organic materials, or other appropriate materials, or combinations of the above.

On the other hand, the isolation structure layer 160 disposed in the display region DR may define a plurality of display pixel regions PXR of the display panel 10, and the plurality of display pixels PX are overlapped with the display pixel regions PXR respectively in a normal direction (e.g., direction Z) of the substrate 100. The display pixels PX include a first electrode PE1, a second electrode PE2, and a light-emitting structure EML sequentially stacked on the flat layer 150. The light-emitting structure EML is sandwiched between the first electrode PE1 and the second electrode PE2. For example, the light-emitting structure EML may include a hole injection layer (not shown), a hole transport layer (not shown), a light-emitting layer (not shown), and an electron transport layer (not shown) sequentially stacked on the first electrode PE1, but the invention is not limited thereto.

The display pixels PX further include an active element T. The first electrode PE1 runs through the flat layer 150 and the insulating layer 140 to electrically connect a drain DE of the active element T. A source (not shown) of the active element T is electrically connected to the signal line 130. In the present embodiment, the signal line 130 and the drain DE of the active element T may belong to a same film, but the invention is not limited thereto. In the present embodiment, the signal line 130 is, for example, a power line, and the first electrode PE1 and the second electrode PE2 are a negative electrode and a positive electrode respectively. When the active element T is enabled, a current may be transmitted to the first electrode PE1 of the display pixels PX via the signal line 130 extending from the bendable region BDR into the display region DR. In this case, the light-emitting structure EML may be driven by the current to emit a (visible) beam, and a luminous intensity of the beam may be controlled by a magnitude of the current or a driving time. Accordingly, the plurality of display pixels PX of the display panel 10 may be independently driven to produce beams with different intensities, and the beams are transmitted to a human eye to form a display image.

In the present embodiment, the first electrode PE1 is, for example, a reflective electrode. A material of the reflective electrode includes a metal, an alloy, a metal nitride, a metal oxide, a metal nitrogen oxide, or other appropriate materials, or a stacked layer of a metal material and other conductive materials. The second electrode PE2 is, for example, a light-penetrating electrode. A material of the light-penetrating electrode includes a metal oxide, such as an indium tin oxide, an indium zinc oxide, an aluminum tin oxide, an aluminum zinc oxide, or other appropriate oxides, or a stacked layer of at least two of the above. That is, the display panel 10 of the present embodiment is a top-emission-type display panel. However, the invention is not limited thereto. According to other embodiments, the display panel may also be a bottom-emission-type display panel.

On the other hand, a material of the flat layer 150 is, for example, an organic insulating material. The organic insulating material may include PI, polyester, benzocyclobutene (BCB), polymethylmethacrylate (PMMA), poly(4-vinylphenol) (PVP), polyvinyl alcohol (PVA), polytetrafluoroethene (PTEE), and hexamethyldisiloxane (HMDSO). A material of the isolation structure layer 160 may be similar to that of the flat layer 150 or other appropriate polymer materials, but the invention is not limited thereto.

Further, the display panel 10 further includes an encapsulation structure ES, covers the plurality of display pixels PX, and extends into the peripheral region PR. In the present embodiment, the display panel 10 may further optionally include a retaining wall structure 190 disposed in the peripheral region PR. A vertical projection of the retaining wall structure 190 on the substrate 100 surrounds the display region DR, and roughly defines a boundary of the encapsulation structure ES. For example, in a process of applying a material of the encapsulation structure, the setting of the retaining wall structure 190 can prevent the material of the encapsulation structure from overflowing to the buffer region BR. In the present embodiment, the retaining wall structure 190 may be a multi-layer stacked structure, for example, a first sub-layer 191 and a second sub-layer 192 sequentially stacked on the insulating layer 140, and the first sub-layer 191 and the isolation structure layer 160 positioned in the display region DR may belong to a same film, but the invention is not limited thereto. It should be noted that in the present embodiment, the retaining wall structure 190 is demonstrated by taking a quantity being two as an example, but the invention is not limited thereto. In other embodiments, the quantity and configuration manner of the retaining wall structure 190 may also be adjusted according to actual design or process requirements.

For example, the encapsulation structure ES may include a first encapsulation layer 171, a second encapsulation layer 172, and a third encapsulation layer 173 sequentially stacked on the insulating layer 140 (or display pixels PX). The second encapsulation layer 172 is filled between the first encapsulation layer 171 and the third encapsulation layer 173. In the present embodiment, materials of the first encapsulation layer 171 and the third encapsulation layer 173 may be optionally identical, for example, silicon nitride ($SiN_x$), but the invention is not limited thereto. In other embodiments, the materials of the first encapsulation layer 171 and the third encapsulation layer 173 may also be different. On the other hand, a material of the second encapsulation layer 172 is, for example, acrylic, epoxy, HMDSO, or other appropriate organic materials.

The display panel 10 further includes an auxiliary layer AXL and a filling layer 200. The auxiliary layer AXL is disposed in the bendable region BDR, and the filling layer 200 covers the encapsulation structure ES and the auxiliary layer AXL. It is worth noting that the auxiliary layer AXL and the encapsulation structure ES may define a recess RS overlapped with the buffer region BR. The auxiliary layer AXL includes a top surface AXLs. A first height H1 is included between the top surface AXLs and a surface 100s of the substrate 100. A second height H2 is included between a bottom surface RSs of the recess RS positioned in the buffer region BR and the surface 100s of the substrate 100. For example, in the present embodiment, a difference between the first height H1 of the top surface AXLs of the auxiliary layer AXL and the second height H2 of the bottom surface RSs of the recess RS is 1.5 µm, but the invention is not limited thereto.

Figure 3:
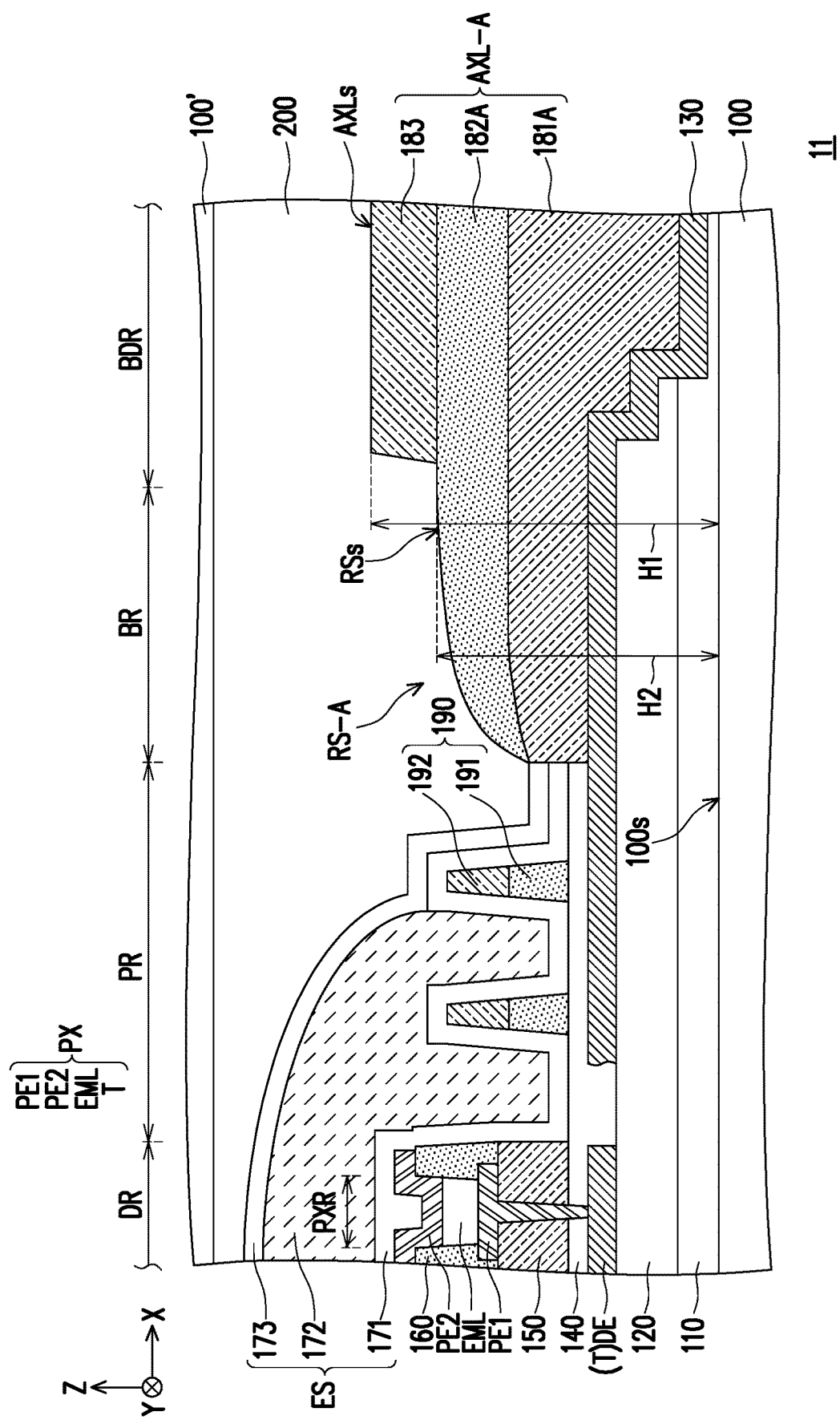
FIG. 3 is a schematic cross-sectional view of a display panel according to a second embodiment of the invention.
Figure 6:
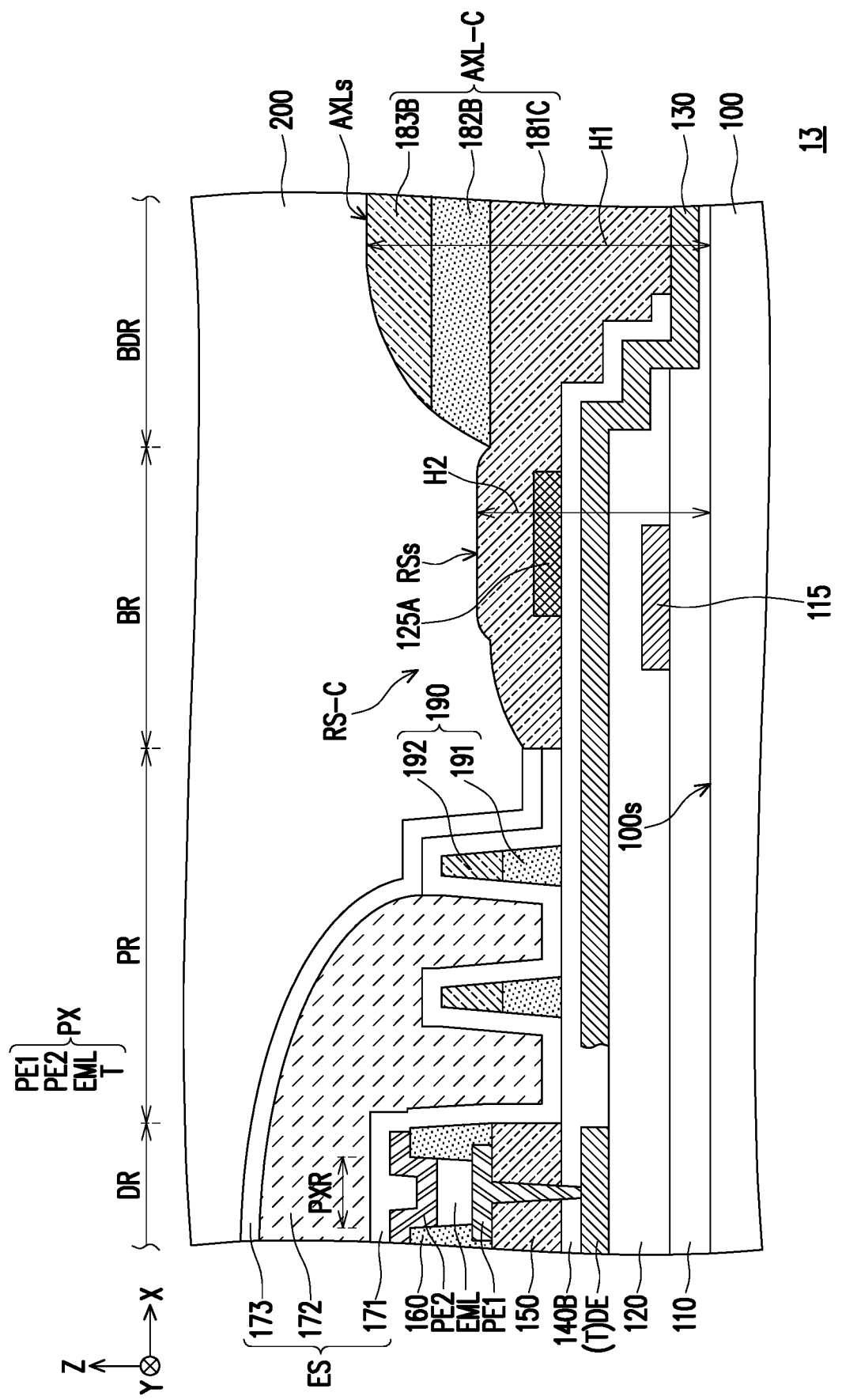
FIG. 6 is a schematic cross-sectional view of a display panel according to a fourth embodiment of the invention.

It should be noted that in the present embodiment, the second height H2 is approximately an average distance between each point on the bottom surface RSs and the surface 100s of the substrate 100, but the invention is not limited thereto. In another embodiment, the second height H2 may also be defined by an average distance between each point on a part of the bottom surface RSs closer to the top surface AXLs of the auxiliary layer AXL and the surface 100s of the substrate 100 (as shown in FIG. 3). In yet another embodiment, the second height H2 may also be defined by an average distance between each point on a part of the bottom surface RSs closer to the center of buffer region BR and the surface 100s of the substrate 100 (as shown in FIG. 6).

The difference between the first height H1 and the second height H2 (i.e., a segment gap between the top surface AXLs of the auxiliary layer AXL and the bottom surface RSs of the recess RS) being greater than 0 μm and less than or equal to 4 μm can prevent accumulation of bubbles generated at a junction between the buffer region BR and the bendable region BDR (i.e., a side of the recess RS close to the auxiliary layer AXL) in a process of manufacturing the filling layer 200. Therefore, during extrusion of the filling layer 200, circuit wiring in the buffer region BR (such as the signal line 130) can be prevented from breaking due to deformation extrusion of bubbles, which helps to improve a production yield and a production margin of the display panel 10.

In the present embodiment, the auxiliary layer AXL may be a stacked structure including a plurality of sub-layers, for example, including a sub-layer 181, a sub-layer 182, and a sub-layer 183 sequentially stacked on the substrate 100. It should be noted that the sub-layer 181 of the auxiliary layer AXL and the encapsulation structure ES may define a recess RS'. Since a height difference between a bottom surface of the recess RS' (i.e., a surface of the signal line 130 or the insulating layer 120) and the top surface AXLs of the auxiliary layer AXL is too large, with the sub-layer 182 of the auxiliary layer AXL extending from the bendable region BDR into the buffer region BR and filling the recess RS', the recess RS can be formed. In other words, with the sub-layer 182 of the auxiliary layer AXL extending into the buffer region BR and covering the insulating layer 120 and the signal line 130, the display panel 10 forms a recess RS with a small depth (e.g., the difference between the first height H1 and the second height H2). Accordingly, accumulation of bubbles generated at a junction between the buffer region BR and the bendable region BDR (i.e., a side of the recess RS close to the auxiliary layer AXL) in a process of manufacturing the filling layer 200 can be prevented.

It is worth noting that a vertical projection of a region between the sub-layer 181 of the auxiliary layer AXL and the encapsulation structure ES (i.e., a region occupied by the recess RS') on the substrate 100 includes a width W in a direction of the display region DR toward the bendable region BDR (e.g., direction X), and the width W is greater than 10 Accordingly, a risk of accumulation of bubbles at the junction between the buffer region BR and the bendable region BDR in the process may be further reduced.

For example, in the present embodiment, materials of the sub-layer 181 of the auxiliary layer AXL and the flat layer 150 in the display region DR may be identical, and materials of the sub-layer 182 of the auxiliary layer AXL and the isolation structure layer 160 in the display region DR may be identical. That is, the sub-layer 181 of the auxiliary layer AXL and the flat layer 150 in the display region DR may belong to a same film, and the sub-layer 182 of the auxiliary layer AXL and the isolation structure layer 160 in the display region DR may belong to a same film, but the invention is not limited thereto. Materials of the sub-layer 183 of the auxiliary layer AXL and the second sub-layer 192 of the retaining wall structure 190 in the peripheral region PR may be identical. That is, the sub-layer 183 of the auxiliary layer AXL and the second sub-layer 192 of the retaining wall structure 190 in the peripheral region PR may belong to a same film, but the invention is not limited thereto.

On the other hand, a material of the filling layer 200 may include acrylic, epoxy, HMDSO, or other appropriate organic materials. In particular, with the sub-layer 182 of the auxiliary layer AXL extending into the buffer region BR and covering the signal line 130, concentration of a stress near the circuit wiring (e.g., signal line 130) can be prevented when the display panel 10 is bent. Besides, a material of the sub-layer 182 of the auxiliary layer AXL may be similar to that of the flat layer 150 or other appropriate polymer materials. The material of the filling layer 200 may be selected from acrylic, epoxy, HMDSO, or other appropriate organic materials. When the display panel 10 is bent, the organic material with a softer texture may further disperse the stress in the buffer region BR. In other words, breakage of the circuit wiring caused by extrusion of the filling layer 200 and the sub-layer 182 of the auxiliary layer AXL can be prevented when the display panel 10 is bent.

Further, the display panel 10 may further include a substrate 100' disposed opposite the substrate 100. For example, the substrate 100' may be optionally provided with a color filter layer, a shading pattern layer, or other functional films or structures, which is not limited in the invention. In the present embodiment, the substrate 100' is, for example, a soft substrate, and a material of the soft substrate may include PI, PET, and PC, but the invention is not limited thereto. In other embodiments, the material of the substrate 100' may also include glass, quartz, or other appropriate organic polymers.

The present disclosure is described in detail below with some other embodiments, where identical members are marked with identical signs, and descriptions of identical technical content are omitted. Reference can be made to the above embodiment for the omitted content, and the descriptions thereof are omitted below.

FIG. 3 is a schematic cross-sectional view of a display panel according to a second embodiment of the invention. Referring to FIG. 3, the display panel 11 of the present embodiment is different from the display panel 10 of FIG. 2 in different configuration manners of the auxiliary layer. Specifically, a sub-payer 181A and a sub-layer 182A of an auxiliary layer AXL-A of the display panel 11 both extend from the bendable region BDR to the buffer region BR and cover the insulating layer 120 and the signal line 130 to form a recess RS-A with a small depth (e.g., the difference between the first height H1 and the second height H2).

For example, in the present embodiment, a difference between a first height H1 of a top surface AXLs of the auxiliary layer AXL-A and a second height H2 of a bottom surface RSs of the recess RS-A is 1.0 μm, but the invention is not limited thereto. Accordingly, accumulation of bubbles generated at a junction between the buffer region BR and the bendable region BDR (i.e., a side of the recess RS-A close to the auxiliary layer AXL-A) in a process of manufacturing the filling layer 200 can be prevented. Therefore, during extrusion of the filling layer 200, circuit wiring in the buffer region BR (such as the signal line 130) can be prevented from breaking due to deformation extrusion of bubbles, which helps to improve a production yield and a production margin of the display panel 11.

Figure 4:
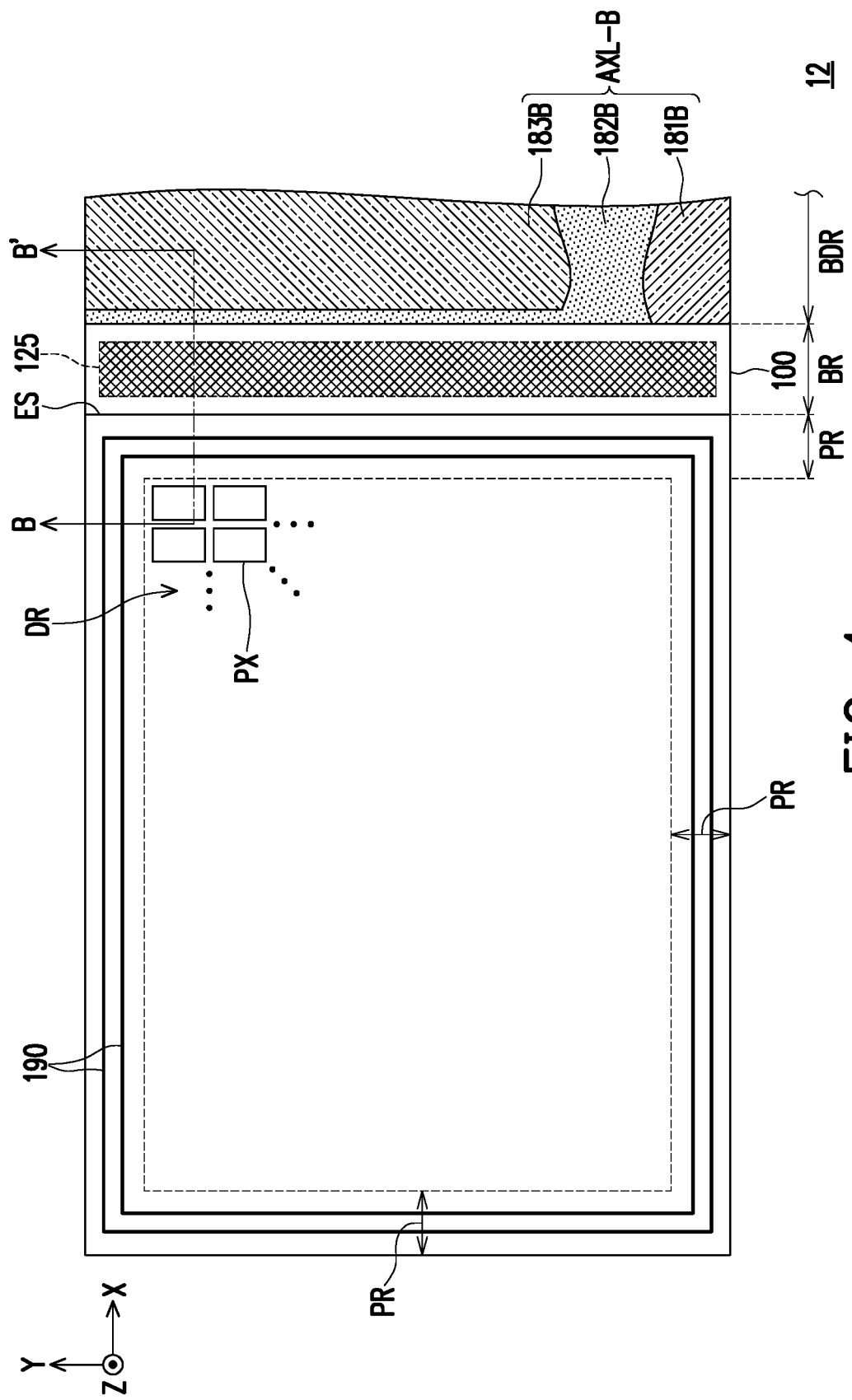
FIG. 4 is a schematic cross-sectional view of a display panel according to a third embodiment of the invention.
Figure 5:
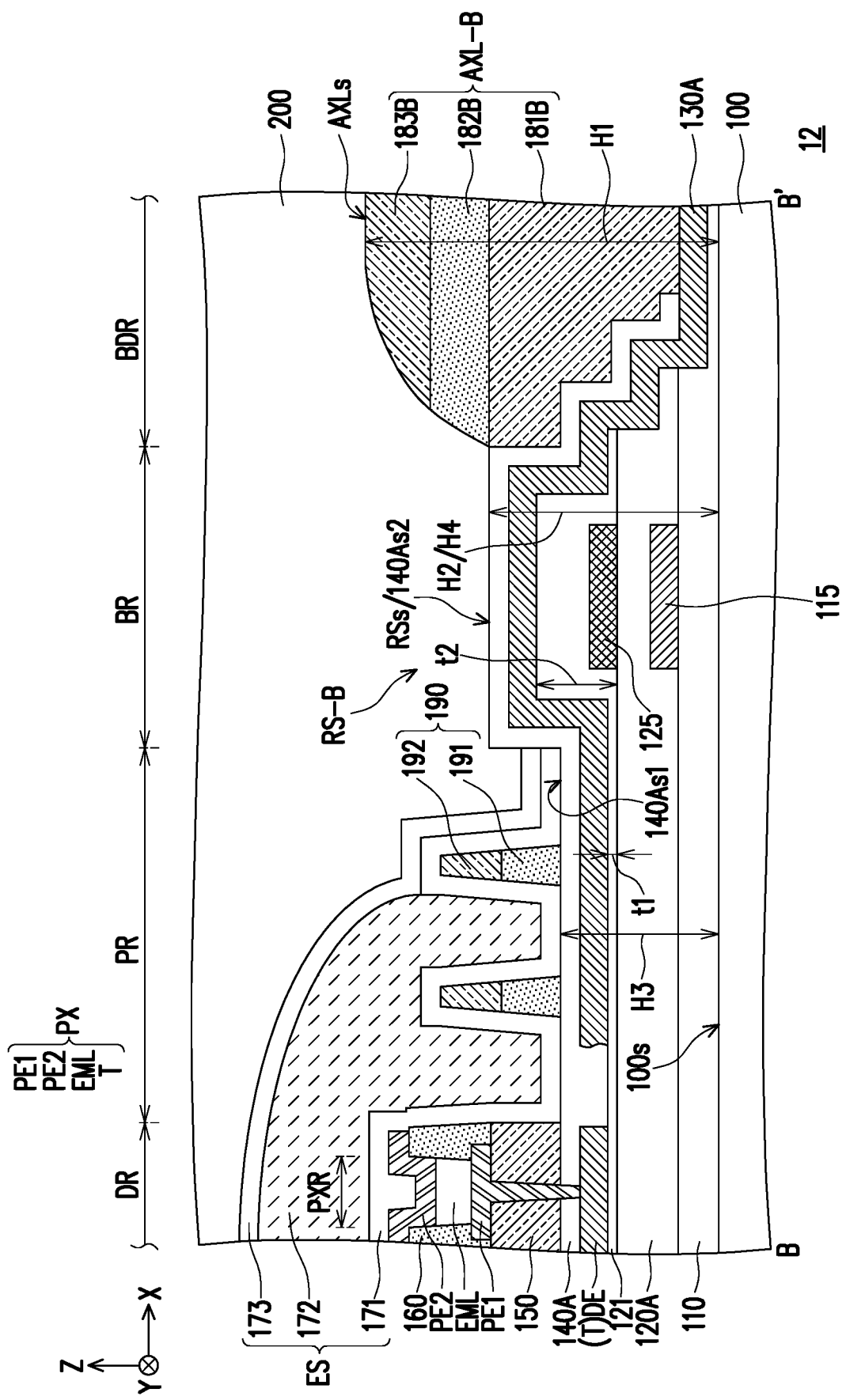
FIG. 5 is a schematic cross-sectional view of the display panel in FIG. 4.

FIG. 4 is a schematic cross-sectional view of a display panel according to a third embodiment of the invention. FIG. 5 is a schematic cross-sectional view of the display panel in FIG. 4. FIG. 5 corresponds to a profile B-B' in FIG. 4. Particularly, illustrations of an insulating layer 110, an insulating layer 120A, an insulating layer 121, a signal line 130A, an insulating layer 140A, a flat layer 150, an isolation structure layer 160, and a filling layer 200 in FIG. 5 are omitted in FIG. 4 for clarity.

Referring to FIG. 4 and FIG. 5, the display panel 12 of the present embodiment is mainly different from the display panel 10 in FIG. 1 and FIG. 2 in different configuration manners of the auxiliary layer AXL and different compositions of the display panel in the buffer region. Specifically, an auxiliary layer AXL-B of the display panel 12 does not extend from the bendable region BDR to the buffer region BR. The display panel 12 further includes a plurality of metal patterns (e.g., a metal pattern 115 and a metal pattern 125) and an insulating layer 121 that are disposed in the buffer region BR, and the display panel 12 may not include the substrate 100' in FIG. 2. In detail, the metal pattern 115 is disposed between the insulating layer 110 and the insulating layer 120A, and the metal pattern 125 is disposed between the insulating layer 120A and the insulating layer 121. In the present embodiment, vertical projections of the two metal patterns on the substrate 100 may be optionally completely overlapped with each other. However, the invention is not limited thereto. In other embodiments, the vertical projections of the two metal patterns on the substrate 100 may also be partially overlapped with each other. On the other hand, the metal pattern 125 (or the metal pattern 115) may extend in a direction Y (i.e., perpendicular to an arrangement direction X of the display region DR, the buffer region BR, and the bendable region BDR), but the invention is not limited thereto. In other embodiments, an extension direction of the metal pattern may be adjusted according to actual design requirements (such as a bendable direction of the display panel).

It is worth noting that by disposing two metal patterns in the buffer region BR, a recess RS-B formed between the encapsulation structure ES and the auxiliary layer AXL-B may have a small depth (e.g., the difference between the first height H1 and the second height H2). For example, in the present embodiment, a difference between a first height H1 of a top surface AXLs of the auxiliary layer AXL-B and a second height H2 of a bottom surface RSs of the recess RS-B is 2.5 μm, but is not limited thereto. Accordingly, accumulation of bubbles generated at a junction between the buffer region BR and the bendable region BDR (i.e., a side of the recess RS-B close to the auxiliary layer AXL-B) in a process of manufacturing the filling layer 200 can be prevented. Therefore, during extrusion of the filling layer 200, circuit wiring in the buffer region BR (such as the signal line 130A) can be prevented from breaking due to deformation extrusion of bubbles, which helps to improve a production yield and a production margin of the display panel 12.

Particularly, in the present embodiment, a thickness of a part of the insulating layer 121 in the display region DR is different from that of another part of the insulating layer 121 in the buffer region BR. More specifically, the two parts of the insulating layer 121 in the display region DR and the buffer region BR have a first thickness t1 and a second thickness t2 respectively, and the second thickness t2 is greater than the first thickness t1. Accordingly, a depth (e.g., the difference between the first height H1 and the second height H2) of the recess RS-B formed between the encapsulation structure ES and the auxiliary layer AXL-B may be further reduced. On the other hand, in the present embodiment, an interface between a sub-layer 181B and a sub-layer 182B of the auxiliary layer AXL-B may be aligned with the bottom RSs of the recess RS-B, but the invention is not limited thereto. Besides, a cross-sectional profile of a side surface of the sub-layer 182B and a sub-layer 183B of the auxiliary layer AXL-B close to the buffer region BR is arc-shaped, so that a risk of accumulation of bubbles at a junction between the buffer region BR and the bendable region BDR in the process can be further reduced.

In the present embodiment, the insulating layer 140A may extend from the display region DR to the bendable region BDR and cover circuit wiring (such as the signal line 130A) in the buffer region BR to prevent the filling layer 200 from directly contacting with the circuit wiring, which helps to improve durability of the display panel 12. Particularly, a third height H3 is included between a surface 140As1 of a part of the insulating layer 140A in the display region DR and the surface 100s of the substrate 100, a fourth height H4 is included between a surface 140As2 of another part of the insulating layer 140A in the buffer region BR (i.e., the bottom RSs of the recess RS-B) and the surface 100s of the substrate 100, and the fourth height H4 is greater than the third height H3.

Further, the metal pattern 115 and the metal pattern 125 of the present embodiment may include a floating potential, that is, the two metal patterns are not electrically connected to any signal wiring or external power supply. In the present embodiment, materials of the metal pattern 115 and a plurality of scan lines (not shown) may be optionally identical, and materials of the metal pattern 125 and a plurality of sensing signal lines (not shown) may be optionally identical. That is, the metal pattern 115 and the plurality of scan lines may belong to a same film, and the metal pattern 125 and the plurality of sensing signal lines may belong to a same film, but the invention is not limited thereto. Additional production costs can be avoided by incorporating manufacturing of the metal patterns into manufacturing processes of other functional films.

FIG. 6 is a schematic cross-sectional view of a display panel according to a fourth embodiment of the invention. Referring to FIG. 6, the display panel 13 of the present embodiment is different from the display panel 12 of FIG. 5 in different configuration manners of the metal patterns and the auxiliary layer. Specifically, a metal pattern 125A of the display panel 13 is disposed on an insulating layer 140B. That is, the display panel 13 may not include the insulating layer 121 of FIG. 5. Further, with a sub-layer 181C of an auxiliary layer AXL-C extending from the bendable region BDR to the buffer region BR and covering the metal pattern 125A, a recess RS-C formed between the encapsulation structure ES and the auxiliary layer AXL-C may have a small depth (e.g., the difference between the first height H1 and the second height H2). Accordingly, accumulation of bubbles generated at a junction between the buffer region BR and the bendable region BDR (i.e., a side of the recess RS-C close to the auxiliary layer AXL-C) in a process of manufacturing the filling layer 200 can be prevented. Therefore, during extrusion of the filling layer 200, reduction of a risk of breakage of circuit wiring in the buffer region BR (such as the signal line 130) due to deformation extrusion of bubbles helps to improve a production yield and a production margin of the display panel 13.

Based on the above, in the display panel according to an embodiment of the present invention, the encapsulation structure overlapped with the display region and the auxiliary layer overlapped with the bendable region define a recess in the buffer region. A height difference between the top surface of the auxiliary layer and the bottom surface of the recess being greater than 0 µm and less than or equal to 4 µm can prevent accumulation of bubbles generated on a side of the recess close to the auxiliary layer and breakage of circuit wiring in the buffer region caused by deformation extrusion of the bubbles in a process of manufacturing the display panel, which helps to improve a process margin and a production yield of the display panel.

What is claimed is:

1. A display panel, comprising:
    a substrate, having a display region, a bendable region, and a buffer region positioned between the display region and the bendable region;
    a plurality of display pixels, disposed in the display region;
    an encapsulation structure, overlapped with the display region and covering the display pixels; and
    an auxiliary layer, overlapped with the bendable region and having a top surface, wherein a first height is comprised between a top surface of the auxiliary layer and a surface of the substrate, the auxiliary layer and the encapsulation structure define a recess overlapped with the buffer region, a second height is comprised between a bottom surface of the recess positioned in the buffer region and the surface of the substrate, and a difference between the first height and the second height is greater than 0 µm and less than or equal to 4 µm.

2. The display panel according to claim 1, wherein the auxiliary layer extends from the bendable region into the buffer region.

3. The display panel according to claim 2, further comprising:
    an isolation structure layer, disposed in the display region, the isolation structure layer defining a plurality of pixel regions, and the display pixels being respectively overlapped with the pixel regions, wherein the auxiliary layer has a first sub-layer extending into the buffer region, and the first sub-layer and the isolation structure layer are in a same film.

4. The display panel according to claim 3, further comprising:
    a flat layer, disposed in the display region and positioned between the substrate and the isolation structure layer, wherein the auxiliary layer further has a second sub-layer extending into the buffer region, and the second sub-layer and the flat layer are in a same film.

5. The display panel according to claim 1, further comprising:
    a metal pattern, disposed in the buffer region and positioned between the recess and the substrate.

6. The display panel according to claim 5, wherein the metal pattern has a floating potential.

7. The display panel according to claim 5, wherein the display region, the buffer region, and the bendable region are arranged in a first direction, and an extension direction of the metal pattern is perpendicular to the first direction.

8. The display panel according to claim 5, further comprising:
    an insulating layer, overlapped with the display region and extending into the buffer region, a first part of the insulating layer positioned in the display region having a first thickness, a second part of the insulating layer positioned in the buffer region having a second thickness, and the second thickness being greater than the first thickness.

9. The display panel according to claim 1, further comprising:
    a signal line, electrically connected to the display pixels; and
    an insulating layer, overlapped with the display region, the insulating layer covering the signal line and extending into the buffer region.

10. The display panel according to claim 9, wherein a third height is comprised between a surface of a first part of the insulating layer positioned in the display region and the surface of the substrate, a fourth height is comprised between a surface of a second part of the insulating layer positioned in the buffer region and the substrate, and the fourth height is greater than the third height.

11. The display panel according to claim 9, further comprising:
    a metal pattern, disposed in the buffer region and positioned on the insulating layer, wherein the auxiliary layer extends from the bendable region into the buffer region and covers the metal pattern.

12. The display panel according to claim 1, wherein a material of the auxiliary layer comprises an organic material.

13. The display panel according to claim 1, wherein the recess has a width in a direction of the display region toward the bendable region and the width is greater than 10 µm.

14. The display panel according to claim 1, further comprising:
    a filling layer, covering the encapsulation structure, the auxiliary layer and the recess positioned in the buffer region.

* * * * *